United States Patent
Schultz

(10) Patent No.: US 9,831,151 B1
(45) Date of Patent: Nov. 28, 2017

(54) HEAT SINK FOR SEMICONDUCTOR MODULES

(71) Applicant: INTERNATIONAL BUSINESS MACHINES CORPORATION, Armonk, NY (US)

(72) Inventor: Mark D. Schultz, Ossining, NY (US)

(73) Assignee: INTERNATIONAL BUSINESS MACHINES CORPORATION, Armonk, NY (US)

(*) Notice: Subject to any disclaimer, the term of this patent is extended or adjusted under 35 U.S.C. 154(b) by 0 days.

(21) Appl. No.: 15/226,971

(22) Filed: Aug. 3, 2016

(51) Int. Cl.
*H01L 23/48* (2006.01)
*H01L 23/367* (2006.01)
*H01L 23/467* (2006.01)
*H01L 23/473* (2006.01)
*H01L 23/00* (2006.01)

(52) U.S. Cl.
CPC ........ *H01L 23/3675* (2013.01); *H01L 23/467* (2013.01); *H01L 23/473* (2013.01); *H01L 24/32* (2013.01); *H01L 2224/32245* (2013.01)

(58) Field of Classification Search
CPC . H01L 23/3675; H01L 23/467; H01L 23/473; H01L 24/32
See application file for complete search history.

(56) References Cited

U.S. PATENT DOCUMENTS

| | | | |
|---|---|---|---|
| 7,187,083 B2 * | 3/2007 | Lewis | B23K 35/302 257/772 |
| 7,323,358 B1 | 1/2008 | Cromwell | |
| 7,486,516 B2 | 2/2009 | Colbert et al. | |
| 7,777,329 B2 | 8/2010 | Colbert et al. | |
| 7,961,469 B2 | 6/2011 | Schmidt et al. | |
| 8,459,334 B2 | 6/2013 | Martin et al. | |
| 8,693,200 B2 | 4/2014 | Colgan et al. | |
| 8,823,164 B2 | 9/2014 | Colgan et al. | |
| 9,059,127 B1 * | 6/2015 | Lamorey | H01L 23/5226 |
| 2004/0247925 A1 | 12/2004 | Cromwell | |
| 2004/0261980 A1 * | 12/2004 | Dani | H01L 23/10 165/104.33 |
| 2005/0127500 A1 | 6/2005 | Colgan et al. | |
| 2008/0013281 A1 * | 1/2008 | Ouyang | H01L 23/3732 361/707 |
| 2010/0181663 A1 * | 7/2010 | Iruvanti | H01L 23/3737 257/713 |
| 2013/0258599 A1 * | 10/2013 | Danello | H01L 23/433 361/706 |

(Continued)

OTHER PUBLICATIONS

Singhal, V., et al., "Optimization of thermal interface materials for electronics cooling applications." IEEE Transactions on Components and Packaging Technologies 27.2 (2004): 244-252.

(Continued)

*Primary Examiner* — Nicholas Tobergte
(74) *Attorney, Agent, or Firm* — F. Chau & Associates, LLC

(57) ABSTRACT

A thermal interface includes a first thermal interface material (TIM) layer and a lid disposed on the first TIM layer. A second TIM layer is disposed on a surface of the lid opposite the first TIM layer. The second TIM layer is from about 75% to about 25% as wide as a width of the lid in at least one direction. A heat sink disposed on a surface of the second TIM layer opposite the lid.

18 Claims, 3 Drawing Sheets

(56) References Cited

U.S. PATENT DOCUMENTS

2015/0138731 A1* 5/2015 Mann .................. H05K 7/20336
361/700
2015/0162307 A1* 6/2015 Chen .................. H01L 23/49827
257/712

OTHER PUBLICATIONS

Wei, X., et al. "Thermal-mechanical Co-design of Cold Plate, Second Level Thermal Interface Material (TIM2) and Heat Spreaders for Optimal Thermal Performance for High-end Processor Cooling." 2016 15th IEEE Intersociety Conference on Thermal and Thermomechanical Phenomena in Electronic Systems (ITherm). IEEE, 2016.

* cited by examiner

HEAT SINK FOR SEMICONDUCTOR MODULES

BACKGROUND

Exemplary embodiments of the present invention relate to a heat sink. More particularly, exemplary embodiments of the present invention relate to a heat sink for semiconductor modules.

Pad type thermal interface materials may be used as interface materials between a heat sink and a lid of a semiconductor package including a lid or a semiconductor module including a lid. For example, thermal interface materials may be employed in semiconductor packages or semiconductor modules including a land grid array (LGA) connector.

Thermal interface material layers may vary in size. For example, a thermal interface material layer may be about a same size as a lid of a semiconductor package or a semiconductor module. Thus, costs associated with including a thermal interface material layer in a semiconductor package or a semiconductor module may be substantially proportional to a size of a lid in the semiconductor package or semiconductor module.

Thermal interface material layers may be loaded at different operating pressures. For example, thermal interface material layers included in semiconductor packages or semiconductor modules may be loaded at a relatively low operating pressure. Thus, thermal interface materials and thermal interface material layers included in semiconductor packages or semiconductor modules, for example, may perform at less than a maximum performance level. For example, thermal interface material layers including thermal interface materials loaded at relatively low operating pressures may result in relatively low thermal performance and/or relatively high thermal resistance.

SUMMARY

Exemplary embodiments of the present invention provide a thermal interface including a first thermal interface material (TIM) layer and a lid disposed on the first TIM layer. A second TIM layer is disposed on a surface of the lid opposite the first TIM layer. The second TIM layer is from about 75% to about 25% as wide as a width of the lid in at least one direction. A heat sink disposed on a surface of the second TIM layer opposite the lid.

According to an exemplary embodiment of the present invention, the second TIM layer may have substantially a same width as a width of an active area of the heat sink.

According to an exemplary embodiment of the present invention, the second TIM layer may be about 50% as wide as a width of the lid in at least one direction.

According to an exemplary embodiment of the present invention, the heat sink may be a rigid heat sink, or a compliant heat sink.

According to an exemplary embodiment of the present invention, the heat sink may be an air cooled heat sink, or a liquid cooled heat sink.

According to an exemplary embodiment of the present invention, a thermal interface material included in the second TIM layer may be loaded at an operating pressure of from about 75 psi to about 150 psi.

Exemplary embodiments of the present invention provide a thermal interface including a first thermal interface material (TIM) layer and a lid disposed on the first TIM layer. A second TIM layer is disposed on a surface of the lid opposite the first TIM layer. A heat sink is disposed on a surface of the second TIM layer opposite the lid. The heat sink includes a first projection in contact with the surface of the lid at a first outer edge of the lid. The first projection forms a first recess between the first projection and the second TIM layer. The heat sink includes a second projection in contact with the surface of the lid at a second outer edge of the lid opposite the first outer edge. The second projection forms a second recess between the second projection and the second TIM layer. The second TIM layer has substantially a same width as a width of an active area of the heat sink.

According to an exemplary embodiment of the present invention, the second TIM layer may be from about 75% to about 25% as wide as a width of the lid.

According to an exemplary embodiment of the present invention, the second TIM layer may be about 50% as wide as a width of the lid.

According to an exemplary embodiment of the present invention, at least one of the first and second projections may include a same thermal interface material as a thermal interface material included in the second TIM layer.

According to an exemplary embodiment of the present invention, the heat sink may be a rigid heat sink.

According to an exemplary embodiment of the present invention, the heat sink may be a compliant heat sink.

According to an exemplary embodiment of the present invention, the heat sink may be an air cooled heat sink.

According to an exemplary embodiment of the present invention, the heat sink may be a liquid cooled heat sink.

According to an exemplary embodiment of the present invention, a thermal interface material included in the second TIM layer may be loaded at an operating pressure of from about 75 psi to about 150 psi.

Exemplary embodiments of the present invention provide a semiconductor device including a substrate and a semiconductor chip disposed on the substrate. A thermal interface is disposed on a surface of the semiconductor chip opposite the substrate. The thermal interface includes a first thermal interface material (TIM) layer disposed on the surface of the semiconductor chip opposite the substrate. A lid is disposed on the first TIM layer. A second TIM layer is disposed on a surface of the lid opposite the first TIM layer. The second TIM layer is from about 75% to about 25% as wide as a width of the lid in at least one direction. A heat sink is disposed on a surface of the second TIM layer opposite the lid.

According to an exemplary embodiment of the present invention, the second TIM layer may be about 50% as wide as a width of the lid in at least one direction.

According to an exemplary embodiment of the present invention, the heat sink may be a rigid heat sink or a compliant heat sink.

According to an exemplary embodiment of the present invention, the heat sink may be an air cooled heat sink or a liquid cooled heat sink.

According to an exemplary embodiment of the present invention, a thermal interface material included in the second TIM layer may be loaded at an operating pressure of from about 75 psi to about 150 psi.

BRIEF DESCRIPTION OF THE DRAWINGS

The above and other features of the present invention will become more apparent by describing in detail exemplary embodiments thereof, with reference to the accompanying drawings, in which.

DETAILED DESCRIPTION

Figure 1:
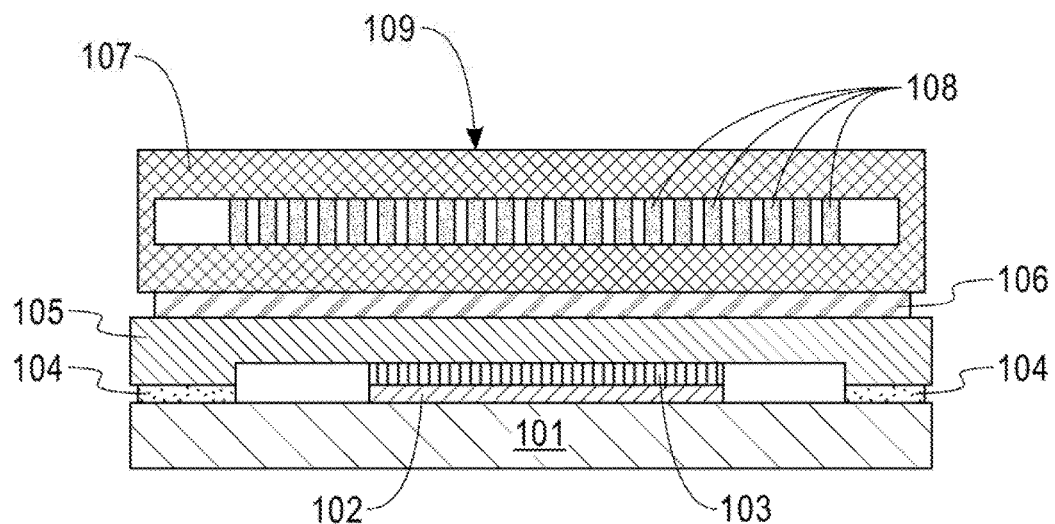
FIG. 1 illustrates a comparative example of a semiconductor package including first and second thermal interface material layers.

It will be understood that the terms "first," "second," "third," etc. are used herein to distinguish one element from another, and the elements are not limited by these terms. Thus, a "first" element in an exemplary embodiment may be described as a "second" element in another exemplary embodiment.

Exemplary embodiments of the present invention will be described more fully hereinafter with reference to the accompanying drawings. Like reference numerals may refer to like elements throughout the specification and drawings.

Pad type thermal interface materials (TIM) may be used as "TIM2" interface materials between a head sink (e.g., a heat sink) and the lid of a lidded semiconductor package/module, particularly in packages utilized with an LGA connector. That is, a second TIM layer may be provided, in addition to a first TIM layer.

To provide load to substantially the entire area of the LGA socket without creating bending loads, the TIM2 may be sized at approximately the same area as the lid area, with a cost generally proportional to area.

Generally, the pad TIM2 materials in use are, as a result of the configuration described above, loaded at a relatively low operating pressure (e.g., to less than their optimal operating pressure). This may result in lower thermal performance/higher thermal resistance than would be the case with more optimal (e.g., higher pressure) loading.

According to exemplary embodiments of the present invention, a semiconductor package including a thermal interface may include a first and a second TIM layer (e.g., the "TIM2" layer). The TIM2 layer may be relatively narrow with regard to a width of a lid of a semiconductor package, while still providing adequate LGA loading by not transmitting load from the heat sink to the lid in the space between the die (or an area slightly bigger than the die) and the lid rim (e.g., a sealband material layer) area of the lid. The TIM2 material may be present at least in the area/nearby area of the die.

According to exemplary embodiments of the present invention, a second TIM layer (e.g., the TIM2 layer) may include indium, graphite or carbon fiber. However, exemplary embodiments of the present invention are not limited thereto, and the second TIM layer according to exemplary embodiments of the present invention may include any desired material.

FIG. 1 illustrates a comparative example of a semiconductor package including first and second thermal interface material layers.

Referring to FIG. 1, a semiconductor device may include a substrate 101, a semiconductor chip 102, a first thermal interface material (TIM) layer 103, a sealband material layer 104, a lid 105, a second TIM layer 106 and a heat sink 107. The heat sink 107 may include an active area 108 where optimal thermal transfer to the coolant occurs. A load 109 may be applied to an upper surface of the heat sink 107.

Referring to FIG. 1, a size (e.g., a width) of the second TIM layer may be substantially the same as a size (e.g., width) of the lid 105.

Figure 2:
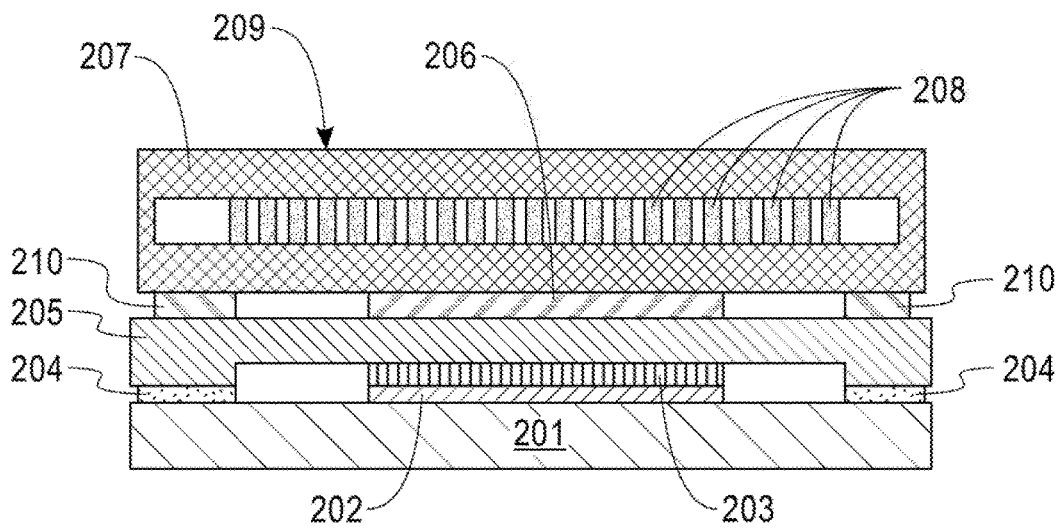
FIG. 2 illustrates a semiconductor package including first and second thermal interface material layers according to one or more exemplary embodiments of the present invention.

FIG. 2 illustrates a semiconductor package including first and second thermal interface material layers according to one or more exemplary embodiments of the present invention.

The semiconductor package described with reference to FIG. 2 may include a rigid heat sink; however exemplary embodiments of the present invention are not limited thereto.

Referring to FIG. 2, according to an exemplary embodiment of the present invention, a semiconductor device may include a substrate 201, a semiconductor chip 202, a first TIM layer 203, a sealband material layer 204, a lid 205, a second TIM layer 206 and a heat sink 207. The heat sink 207 may include an active area 208. A load 209 may be applied to an upper surface of the heat sink 207. The semiconductor module assembly may additionally include an LGA connector connecting the module to the system it is installed in.

The second TIM layer 206 may be relatively narrower (smaller in area) than the second TIM layer 106 described above with reference to FIG. 1.

The semiconductor device including the second TIM layer 206 may include at least one spacer 210. For example, the semiconductor device including the second TIM layer 206 may include two spacers 210. Each of the spacers 210 may include a same thermal interface material as a thermal interface material included in the second TIM layer 206. Each of the spacers 210 may have substantially a same thickness as a thickness of the second TIM layer 206. However, exemplary embodiments of the present invention are not limited thereto. For example, the spacers 210 may be omitted.

According to an exemplary embodiment of the present invention, the spacers 210 may include silicon or rubber. However, exemplary embodiments of the present invention are not limited thereto, and the spacers 210 may include any desired material.

According to an exemplary embodiment of the present invention, a thermal interface may include the first TIM layer 203 and the lid 205 disposed on the first TIM layer 203. The second TIM layer 206 may be disposed on a surface of the lid 205 opposite the first TIM layer 203. The second TIM layer 206 may be from about 75% to about 25% as wide as a width of the lid 205. For example, the second TIM layer 206 may be from about 75% to about 25% as wide as a width of the lid 205 in either or both of an X and Y direction (see, e.g., FIG. 5). A heat sink 207 may be disposed on a surface of the second TIM layer 206 opposite the lid 205.

According to an exemplary embodiment of the present invention, the second TIM layer 206 may have substantially a same width as a width of the active area 208 of the heat sink 207.

According to an exemplary embodiment of the present invention, the second TIM layer 206 may be about 50% as wide as a width of the lid 205. However, exemplary embodiments of the present invention are not limited thereto, and the second TIM layer 206 may be any desired width. For example, the second TIM layer 206 may be any width that is significantly smaller than the lid 205 in at least one direction (e.g., an X or Y direction).

According to an exemplary embodiment of the present invention, the heat sink 207 may be a rigid heat sink, or a compliant heat sink. According to an exemplary embodiment of the present invention, the heat sink 207 may be an air cooled heat sink, or a liquid cooled heat sink. However, exemplary embodiments of the present invention are not limited thereto, and the heat sink 207 may have any desired configuration or may be any desired type of heat sink.

According to an exemplary embodiment of the present invention, a thermal interface material included in the second TIM layer 206 may be loaded at an operating pressure of from about 75 psi to about 150 psi. This pressure range may be a function of the performance characteristics of the second TIM layer under varying pressure loads. The load pressure is determined to first order by the total load used through the heat sink to socket the part and/or hold the heat sink to the part divided by the total area of TIM 206 and spacer 210. Either increasing the total load or reducing the TIM 206 and/or spacer 210 area will serve to increase the load pressure. Optimum TIM 206 load pressure is determined by experimental measurements of thermal performance versus load pressure for any given TIM material.

According to exemplary embodiments of the present invention, a sealband material layer (e.g., the sealband material layer 204) may be replaced by a lid rim. That is, first and second lower projections of the lid (e.g., the lid 205) may be in direct contact with the substrate (e.g., the substrate 201), and a sealband material layer may be omitted.

Figure 3:
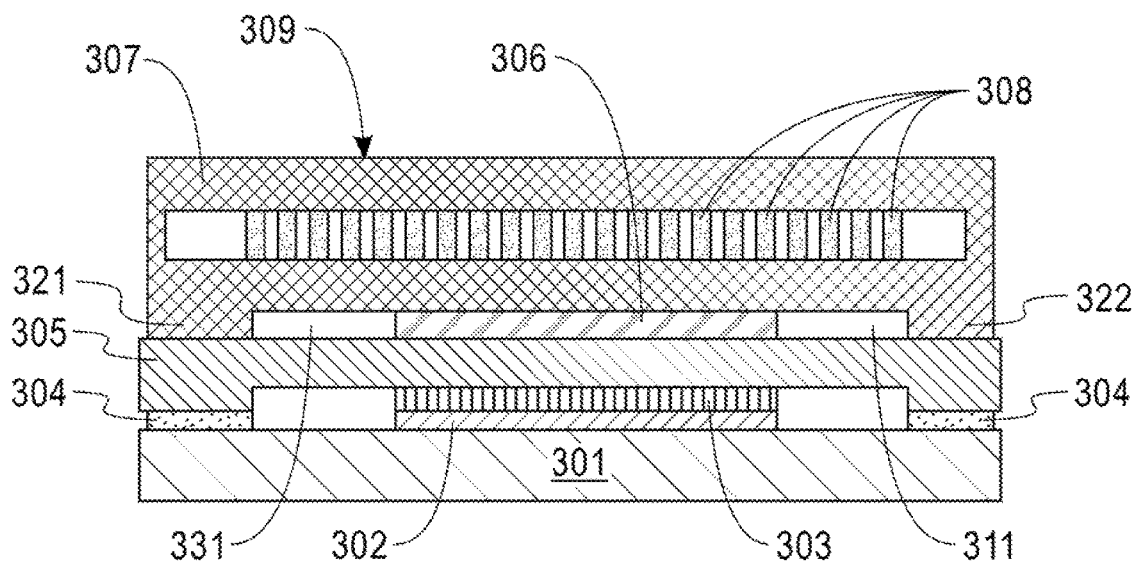
FIG. 3 illustrates a semiconductor package including first and second thermal interface material layers according to one or more exemplary embodiments of the present invention.

FIG. 3 illustrates a semiconductor package including first and second thermal interface material layers according to one or more exemplary embodiments of the present invention.

The semiconductor package described with reference to FIG. 3 may include a rigid heat sink; however exemplary embodiments of the present invention are not limited thereto.

Referring to FIG. 3, according to an exemplary embodiment of the present invention, a semiconductor device may include a substrate 301, a semiconductor chip 302, a first TIM layer 303, a sealband material layer 304, a lid 305, a second TIM layer 306 and a heat sink 307. The heat sink 307 may include a die 308 (e.g., an active area). A load 309 may be applied to an upper surface of the heat sink 307. The heat sink 307 may include a first projection 321 forming a first recess 331 and a second projection 322 forming a second recess 311. The first and second recess 331 and 311 may be formed in a bottom of the heat sink 307. The semiconductor module assembly may additionally include an LGA connector.

The second TIM layer 306 may be relatively narrower (smaller area) than the second TIM layer 106 described above with reference to FIG. 1.

According to an exemplary embodiment of the present invention, a thermal interface may include the first TIM layer 303 and the lid 305 disposed on the first TIM layer 303. The second TIM layer 306 may be disposed on a surface of the lid 305 opposite the first TIM layer 303. The heat sink 307 may be disposed on a surface of the second TIM layer 306 opposite the lid 305. The heat sink 307 may include the first projection 321 in contact with the surface of the lid 305 at a first outer edge of the lid 305. The first projection 321 may form the first recess 331 between the first projection 321 and the second TIM layer 306. The heat sink 307 may include the second projection 322 in contact with the surface of the lid 305 at a second outer edge of the lid 305 opposite the first outer edge. The second projection 322 may form the second recess 311 between the second projection 322 and the second TIM layer 306. The second TIM layer 306 may have substantially a same width as a width of the active area 308 of the heat sink 307.

According to an exemplary embodiment of the present invention, the second TIM layer 306 may be from about 75% to about 25% as wide as a width of the lid 305 (e.g., in either or both of X and Y directions). According to an exemplary embodiment of the present invention, the second TIM layer 306 may be about 50% as wide as a width of the lid 305. However, exemplary embodiments of the present invention are not limited thereto, and the second TIM layer 306 may be any desired width. For example, the second TIM layer 206 may be any width that is significantly smaller than the lid 205 in at least one direction (e.g., an X or Y direction).

According to an exemplary embodiment of the present invention, at least one of the first and second projections 321 and 322 may include a same material as a material included in the heat sink 307. For example, each of the first and second projections 321 and 322 may be a continuation of the heat sink 307 without an interface between the heat sink 307 and the first and second projections 321 and 322. Alternatively, at least one of the first and second projections 321 and 322 may include a same thermal interface material as a thermal interface material included in the second TIM layer 306.

According to an exemplary embodiment of the present invention, the heat sink 307 may be a rigid heat sink. According to an exemplary embodiment of the present invention, the heat sink 307 may be a compliant heat sink. According to an exemplary embodiment of the present invention, the heat sink 307 may be an air cooled heat sink. According to an exemplary embodiment of the present invention, the heat sink 307 may be a liquid cooled heat sink. However, exemplary embodiments of the present invention are not limited thereto, and the heat sink 307 may have any desired configuration or may be any desired type of heat sink.

According to an exemplary embodiment of the present invention, a thermal interface material included in the second TIM layer 306 may be loaded at an operating pressure of from about 75 psi to about 150 psi.

According to exemplary embodiments of the present invention, a sealband material layer (e.g., the sealband material layer 304) may be replaced by a lid rim. That is, first and second lower projections of the lid (e.g., the lid 305) may be in direct contact with the substrate (e.g., the substrate 301), and a sealband material layer may be omitted.

Referring to FIGS. 2 and 3, an exemplary embodiment of the present invention may provide a semiconductor device including a substrate and a semiconductor chip disposed on the substrate. A thermal interface may be disposed on a surface of the semiconductor chip opposite the substrate. The thermal interface may include a first thermal interface material (TIM) layer disposed on the surface of the semiconductor chip opposite the substrate. A lid may be disposed on the first TIM layer. A second TIM layer may be disposed on a surface of the lid opposite the first TIM layer. The second TIM layer may be from about 75% to about 25% as wide as a width of the lid (e.g., in either or both of X and Y directions). A heat sink may be disposed on a surface of the second TIM layer opposite the lid.

According to an exemplary embodiment of the present invention, the second TIM layer may be about 50% as wide as a width of the lid (e.g., in either or both of X and Y directions).

According to an exemplary embodiment of the present invention, the heat sink may be a rigid heat sink or a compliant heat sink. According to an exemplary embodiment of the present invention, the heat sink may be an air cooled heat sink or a liquid cooled heat sink. However, exemplary embodiments of the present invention are not limited thereto, and the heat sink may have any desired configuration or may be any desired type of heat sink.

According to an exemplary embodiment of the present invention, a thermal interface material included in the second TIM layer may be loaded at an operating pressure of from about 75 psi to about 150 psi.

Figure 4:
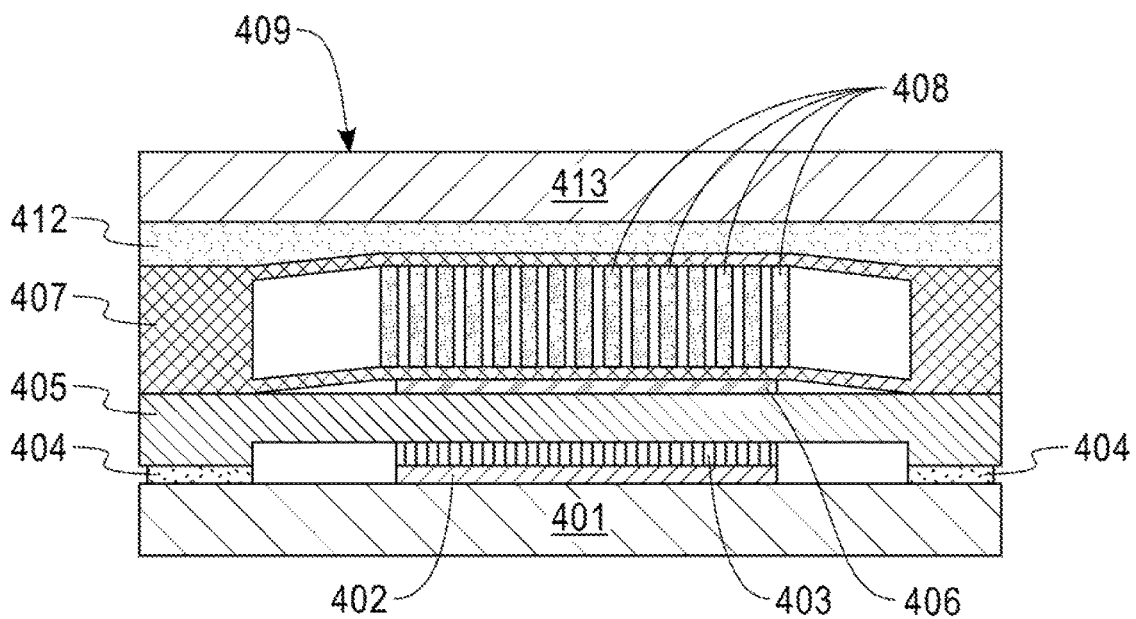
FIG. 4 illustrates a semiconductor package including first and second thermal interface material layers according to one or more exemplary embodiments of the present invention.

FIG. 4 illustrates a semiconductor package including first and second thermal interface material layers according to one or more exemplary embodiments of the present invention.

The semiconductor package described with reference to FIG. 4 may include a compliant heat sink; however exemplary embodiments of the present invention are not limited thereto.

Referring to FIG. 4, according to an exemplary embodiment of the present invention, a semiconductor device may include a substrate 401, a semiconductor chip 402, a first TIM layer 403, a sealband material layer 404, a lid 405, a second TIM layer 406, a heat sink 407, an elastomer layer 412 and a load plate 413. The heat sink 407 may include an active area 408. A load 409 (e.g., a spring load) may be applied to an upper surface of the load plate 413. The semiconductor module assembly may additionally include an LGA connector.

The second TIM layer 406 may be relatively narrower than the second TIM layer 106 described above with reference to FIG. 1.

According to an exemplary embodiment of the present invention, the second TIM layer 406 may be from about 75% to about 25% as wide as a width of the lid 405 (e.g., in either or both of X and Y directions). According to an exemplary embodiment of the present invention, the second TIM layer 406 may be about 50% as wide as a width of the lid (e.g., in either or both of X and Y directions). However, exemplary embodiments of the present invention are not limited thereto, and the second TIM layer 406 may be any desired width. For example, the second TIM layer 206 may be any width that is significantly smaller than the lid 205 in at least one direction (e.g., an X or Y direction).

The second TIM layer 406 may be relatively thinner than the second TIM layer 106 described above with reference to FIG. 1. For example, the second TIM layer 406 may be thinner as a result of the spring load 409 applied to a top surface of the load plate 413.

Outer ends of the heat sink 407 may be in directed contact with an upper surface of the lid 405. For example, the heat sink 407 may be conformally disposed on the lid 405 and the second TIM layer 406. The spacers (e.g., spacers 210) and the projections (e.g., projections 321 and 322) may be omitted and thus the spring load 409 may press the outer ends of the heat sink 407 downward to be in contact with the upper surface of the lid 405.

According to an exemplary embodiment of the present invention, the elastomer layer 412 may include silicon or rubber. However, exemplary embodiments of the present invention are not limited thereto, and the elastomer layer 412 may include any desired material.

According to exemplary embodiments of the present invention, reducing a size of the second TIM layer (e.g., in a lidded semiconductor device) may increase performance of the second TIM layer (e.g., by about 50% or more) and may reduce the costs associated with forming the second TIM layer. For example, the second TIM layer may be at a relatively high operating pressure (e.g., at an operating pressure of from about 75 psi to about 150 psi) and thus, performance of the semiconductor device may be increased. Additionally, a size of the second TIM layer may be relatively small, and thus an amount of thermal interface material used for forming the second TIM layer may be reduced, thus reducing manufacturing costs.

Figure 5:
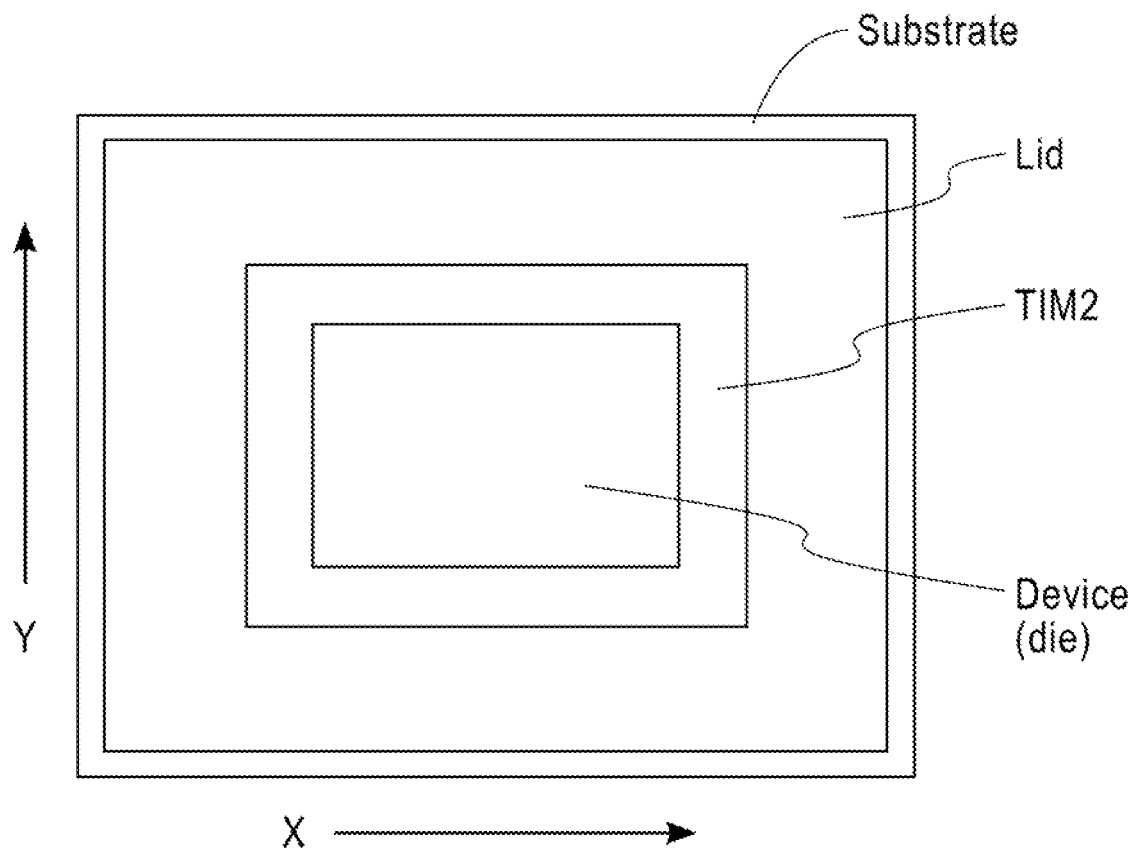
FIG. 5 is a plan view of a semiconductor package including first and second thermal interface material layers according to one or more exemplary embodiments of the present invention.

FIG. 5 is a plan view of a semiconductor package including first and second thermal interface material layers according to one or more exemplary embodiments of the present invention.

FIG. 5 illustrates an X and a Y direction. According to an exemplary embodiment of the present invention, a thermal interface may include the first TIM layer 203 and the lid 205 disposed on the first TIM layer 203. The second TIM layer 206 may be disposed on a surface of the lid 205 opposite the first TIM layer 203. The second TIM layer 206 may be from about 75% to about 25% as wide as a width of the lid 205 in either or both X and Y directions. The cross section shown may be considered to be a cross section in the x direction, with the y direction being into or out of the plane of the page. A heat sink 207 may be disposed on a surface of the second TIM layer 206 opposite the lid 205.

The cross-sections described above with reference to FIGS. 2-4 may each be cross sections along the X direction, with the Y direction being a direction into or out of the plane of the page.

While the present invention has been particularly shown and described with reference to exemplary embodiments thereof, it will be understood by those of ordinary skill in the art that various changes in form and detail may be made therein without departing from the spirit and scope of the present invention as defined by the following claims.

The invention claimed is:

1. A thermal interface, comprising:
   a first thermal interface material (TIM) layer;
   a lid disposed on the first TIM layer;
   a second TIM layer disposed on a surface of the lid opposite the first TIM layer, wherein the second TIM layer is from about 75% to about 25% as wide as a width of the lid in at least one direction; and
   a heat sink disposed on a surface of the second TIM layer opposite the lid,
   wherein the second TIM layer has substantially a same width as a width of an active area of the heat sink.

2. The thermal interface of claim 1, wherein the second TIM layer is about 50% as wide as a width of the lid in at least one direction.

3. The thermal interface of claim 1, wherein the heat sink is a rigid heat sink, or a compliant heat sink.

4. The thermal interface of claim 1, wherein the heat sink is an air cooled heat sink, or a liquid cooled heat sink.

5. The thermal interface of claim 1, wherein a thermal interface material included in the second TIM layer is loaded at an operating pressure of from about 75 psi to about 150 psi.

6. A thermal interface, comprising:
   a first thermal interface material (TIM) layer;
   a lid disposed on the first TIM layer;
   a second TIM layer disposed on a surface of the lid opposite the first TIM layer;

a heat sink disposed on a surface of the second TIM layer opposite the lid,
wherein the heat sink comprises a first projection in contact with the surface of the lid at a first outer edge of the lid,
wherein the first projection forms a first recess between the first projection and the second TIM layer,
wherein the heat sink comprises a second projection in contact with the surface of the lid at a second outer edge of the lid opposite the first outer edge,
wherein the second projection forms a second recess between the second projection and the second TIM layer, and
wherein the second TIM layer has substantially a same width as a width of an active area of the heat sink.

7. The thermal interface of claim 6, wherein the second TIM layer is from about 75% to about 25% as wide as a width of the lid.

8. The thermal interface of claim 7, wherein the second TIM layer is about 50% as wide as a width of the lid.

9. The thermal interface of claim 6, wherein at least one of the first and second projections comprises a same thermal interface material as a thermal interface material included in the second TIM layer.

10. The thermal interface of claim 6, wherein the heat sink is a rigid heat sink.

11. The thermal interface of claim 6, wherein the heat sink is a compliant heat sink.

12. The thermal interface of claim 6, wherein the heat sink is an air cooled heat sink.

13. The thermal interface of claim 6, wherein the heat sink is a liquid cooled heat sink.

14. The thermal interface of claim 6, wherein a thermal interface material included in the second TIM layer is loaded at an operating pressure of from about 75 psi to about 150 psi.

15. A semiconductor device, comprising;
a substrate;
a semiconductor chip disposed on the substrate; and
a thermal interface disposed on a surface of the semiconductor chip opposite the substrate,
wherein the thermal interface comprises:
a first thermal interface material (TIM) layer disposed on the surface of the semiconductor chip opposite the substrate;
a lid disposed on the first TIM layer;
a second TIM layer disposed on a surface of the lid opposite the first TIM layer, wherein the second TIM layer is from about 75% to about 25% as wide as a width of an upper surface of the lid, wherein the second TIM layer is about 50% as wide as a width of the lid in at least one direction; and
a heat sink disposed on a surface of the second TIM layer opposite the lid.

16. The thermal interface of claim 15, wherein the heat sink is a rigid heat sink or a compliant heat sink.

17. The thermal interface of claim 15, wherein the heat sink is an air cooled heat sink or a liquid cooled heat sink.

18. The thermal interface of claim 15, wherein a thermal interface material included in the second TIM layer is loaded at an operating pressure of from about 75 psi to about 150 psi.

* * * * *